(12) United States Patent
Hsu et al.

(10) Patent No.: US 7,775,821 B2
(45) Date of Patent: Aug. 17, 2010

(54) SOCKET FOR BURN-IN TESTS

(75) Inventors: Hsiu-Yuan Hsu, Tu-Cheng (TW);
Wei-Chih Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/543,433

(22) Filed: Aug. 18, 2009

(65) Prior Publication Data

US 2010/0041254 A1 Feb. 18, 2010

(30) Foreign Application Priority Data

Aug. 18, 2008 (TW) ............................... 97131449 A

(51) Int. Cl.
*H01R 11/22* (2006.01)
(52) U.S. Cl. ...................................... 439/266
(58) Field of Classification Search ................ 439/266, 439/331

See application file for complete search history.

(56) References Cited

U.S. PATENT DOCUMENTS

| 4,491,377 | A | * | 1/1985 | Pfaff | ........................ 439/267 |
| 5,443,396 | A | * | 8/1995 | Tokushige | .................. 439/266 |
| 6,354,856 | B1 | * | 3/2002 | Shimada | ..................... 439/266 |
| 7,413,458 | B2 | | 8/2008 | Enplas | |
| 2006/0228926 | A1 | | 10/2006 | Sato et al. | |

FOREIGN PATENT DOCUMENTS

| EP | 1091628 | * | 4/2001 |
| TW | 461150 | | 10/2001 |
| TW | M351469 | | 2/2009 |

\* cited by examiner

*Primary Examiner*—Neil Abrams
(74) *Attorney, Agent, or Firm*—Andrew C. Cheng; Wei Te Chung; Ming Chieh Chang

(57) ABSTRACT

A socket adapted for interconnecting an IC package (3), such as TSOP (Thin Small Outline Package), and a circuit board, includes a socket body (1), a plurality of contacts (2) received in the socket body, and an operating member (5) movable mounted on the socket body. Each contact includes a base portion (21) retained into the slot of the socket body and a first and a second contact beams (24, 25), each extending upwardly from an upper edge of the base portion. When a force is applied on the operating member, both of the first and the second contact beams cooperated with the operating member and moving away from its original position. A stick (6) mounted to the member (5) may be provided to cause movement of the second contact (25).

14 Claims, 5 Drawing Sheets

US 7,775,821 B2

SOCKET FOR BURN-IN TESTS

BACKGROUND OF THE INVENTION

1. Field of the Invention

The present invention relates to a socket, and more particularly to a socket for burn-in tests.

2. Description of the Related Art

European Patent Application No. 1091628 discloses a socket including a base or main socket body 2, an operating cover member 3 movable mounted on the socket body 2, electrically conductive contact members 4, and a spring 5. The socket body 2 is provided with an IC package seating surface 2b for receiving the IC package 6. The IC package 6 has body 60 in the form of a thin rectangular polyhedron and a selected number of IC terminal leads 61 extending outwardly from opposing sides of the body in the lateral direction. Each contact member 4 has a generally U-shaped central portion comprising a first and a second mounting legs 40 and 41 and a number of leads 42 extending from the second mounting leg 41 beyond a bottom of the socket body 2 for connection to a printed circuit board. A first and a second contact parts 43 and 44 opposing to each other are provided on the first mounting leg 40. The first contact part 43 comprises a spring part 43a extending from an upper edge of the first mounting leg 40 and a bifurcated end forming a contact arm part 43b and a lever part 43c. Tip of the contact arm part 43b forms a first electrical contact 43e. The second contact part 44 comprises an arm 44a extending from an upper edge of the first mounting leg 40 and a second electrical contact 44b is formed on tip of the arm 44a and an engagement part 44c is formed on the middle area of arm 44a adapted for positioning and engaging the second contact part 44 relative the socket body 2.

Before the contact member 4 is mounted on the socket body 2, the second electrical contact 44b is so formed as to be somewhat separated from the first electrical contact 43e. When the operating cover 3 of the socket is pressed down, a cam surface 32 formed on the operating cover 3 engages the follower tip of the lever part 43c of the contact member 4 and if the operating cover 3 is further pressed down, the lever part 43c of the contact member 4 is cammed along the cam surface 32 of the operating cover 3. Along with this, the first electrical contact part 43e moves in a direction away from the second electrical contact 44b of the contact member 4. When there is no downward force on the operating cover 3, the operating cover 3 is pushed up by a spring forces of the spring 5 and the contact member 4. In conformity with this, each IC package terminal lead 61 is sandwiched by the first and second electrical contact 43e and 44b of a respective contact member 4 and the IC package terminal lead 61 are electrically connected.

SUMMARY OF THE INVENTION

An object of present invention is to provide a socket, of which the contact member is well electrically connected with the IC package terminal lead.

To achieve the above-mentioned object, a socket adapted for electrically connecting a semiconductor package and a printed circuit board, comprises: a socket body with a plurality of terminal contact slots, a plurality of contacts received in corresponding contact slots, and an operating member movable mounted on the socket body. Each contact includes a base portion retained into the slot of the socket body and a first and second contact beams, each extending upwardly from an upper edge of the base portion. When a force is applied on the operating member, both of the first and the second contact beams cooperated with said operating member and moving away from original position.

To achieve the above-mention object, a contact member comprising: base portion, tail portion extending downwardly from the base portion, a first and a second contact sections extending upwardly from the base portion. The first contact section has a first spring arm formed by a long thin sinuous member extending from an upper edge of the base portion and a bifurcated end including a contact arm part and a lever part. A first electrical contact portion is provided on a distal tip of the contact arm part, and the second contact section has a second spring arm extending upwardly from the base portion and a second electrical contact portion is defined on a distal tip of the second spring arm and arranged opposite to the first electrical contact portion. Wherein the first and second contact section are capable of moving away from each other.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
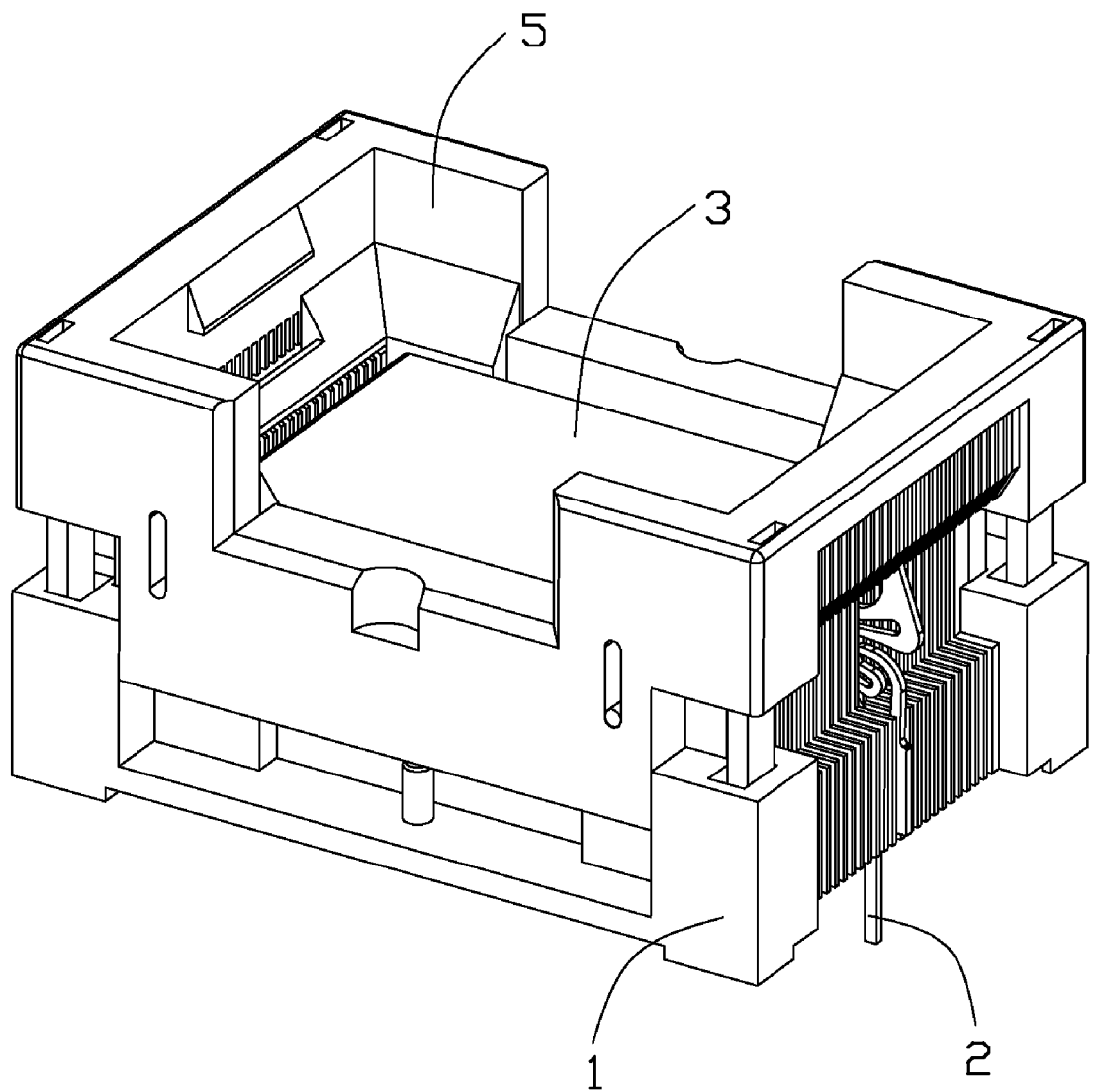
FIG. 1 is an assembled, perspective view of a socket in accordance with a preferred embodiment of present invention.
Figure 2:
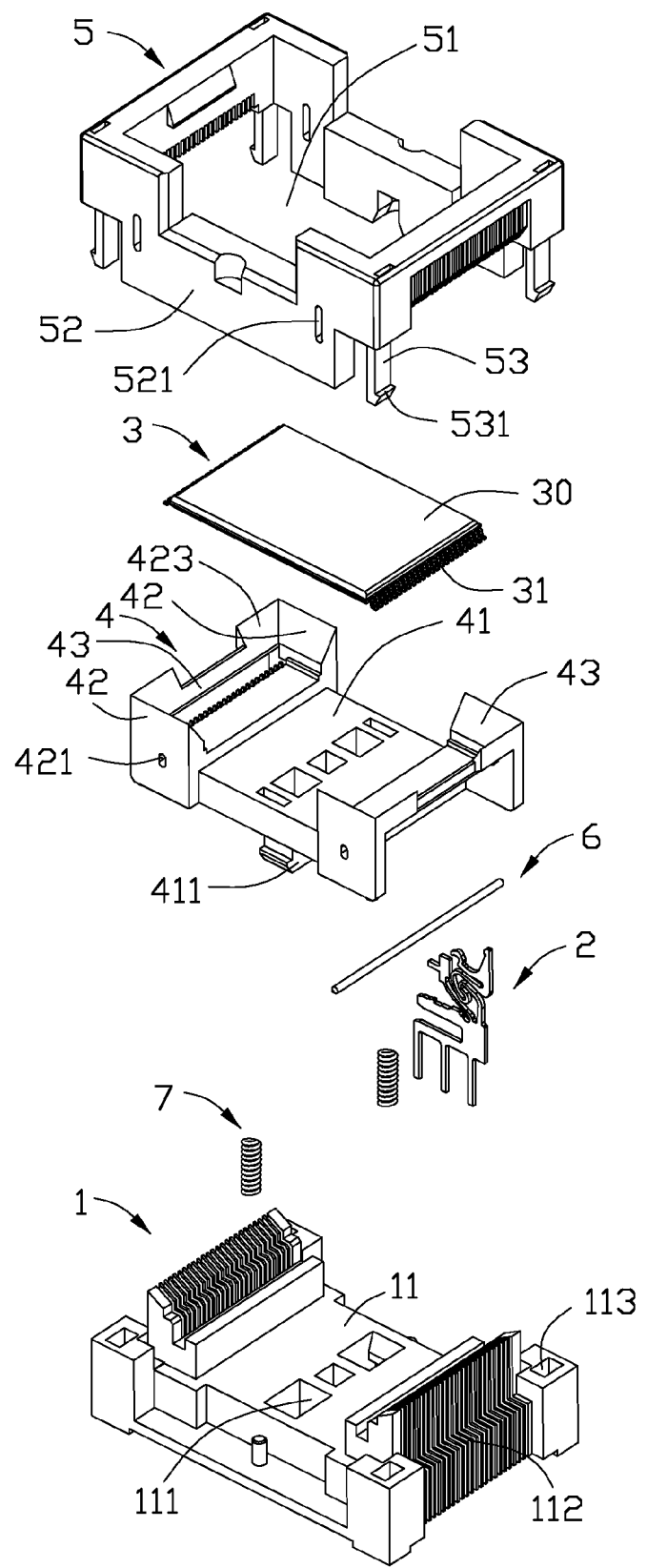
FIG. 2 is an exploded, perspective view of the socket in accordance with the preferred embodiment of present invention.

Referring to FIGS. 1-2, a socket, particular adapted for use with a TSOP (Thin Small Outline Package), comprises a socket body 1, a plurality of conductive terminal contacts 2 retained in the socket body 1, an operating cover 5 movable mounted upon the socket body 1, an adaptor 4 mounted upon the socket body 1 to form a body sub-assembly, and a stick 6 penetrating the adaptor 4 and the operating cover 5.

Please particular refer to FIG. 2, an IC package 3 received in the socket has a body 30 in the form of a thin rectangular polyhedron and a selected number of IC terminal leads 31 extending outwardly of opposing sides in the lateral direction of the body 30. When the IC package 3 is put into the socket, it is sandwiched by the conductive terminal contacts 2.

Please still refer to FIG. 2, the socket body 1 has a supporting part 11 formed on a main body thereof with a pair of through holes 111 and four retaining holes 113 are formed on four corners of the socket body 1. Further, a plurality of slots 112 are arranged on opposed sides along a long edge part of the socket body 1 for positioning each terminal contact 2. The number and interval of the slots 112 are selected to be the same as the number and interval of the terminal leads 31 of the IC package 3.

Please still refer to FIG. 2, the adaptor 4 is provided with a seating surface 41 formed on a top surface of the adaptor 4 for receipt of the IC package 3. Two opposing front and rear walls 42 and two opposing side walls 43 are formed, each extending upwardly from corresponding edge thereof, and each top face of the front wall, the rear wall and the side walls 42 and 43 is somewhat higher than that of the seating surface 41. Guide portions 423 are formed on inner surface of the front wall, the rear wall and the side walls 42 and 43 of the adaptor 4 adjacent to peripheral edge of the seating surface 41 for guiding the IC package 3 onto the seating surface 41. Further more, a pair of blocks 411 are formed on a bottom surface of the adaptor 4 and extend downwardly so as to engage with the through hole 111 of the socket body 1.

The operating cover 5 is a generally elongate polygonal frame shaped member of suitable material, such as plastic. The operating cover 5 has an opening 51 which is somewhat larger than the external configuration of the IC package 3. At each corner of the operating cover 5, an engaging leg 53 extends in approximately a vertical direction. After the engaging legs 53 are inserted into the retaining hole 113 of the socket body 1, the operating cover 5 is movable up and down relative to the socket body 1 and limited by a hook portion 531 provided on the engaging leg 53 engaging with a catch formed in the retaining hole 113 of the socket body 1. As shown in FIG. 2, the operating cover 5 is biased in a direction away from the socket body 1 by means of a spring 7 provided between the socket body 1 and the operating cover 5.

Figure 3:
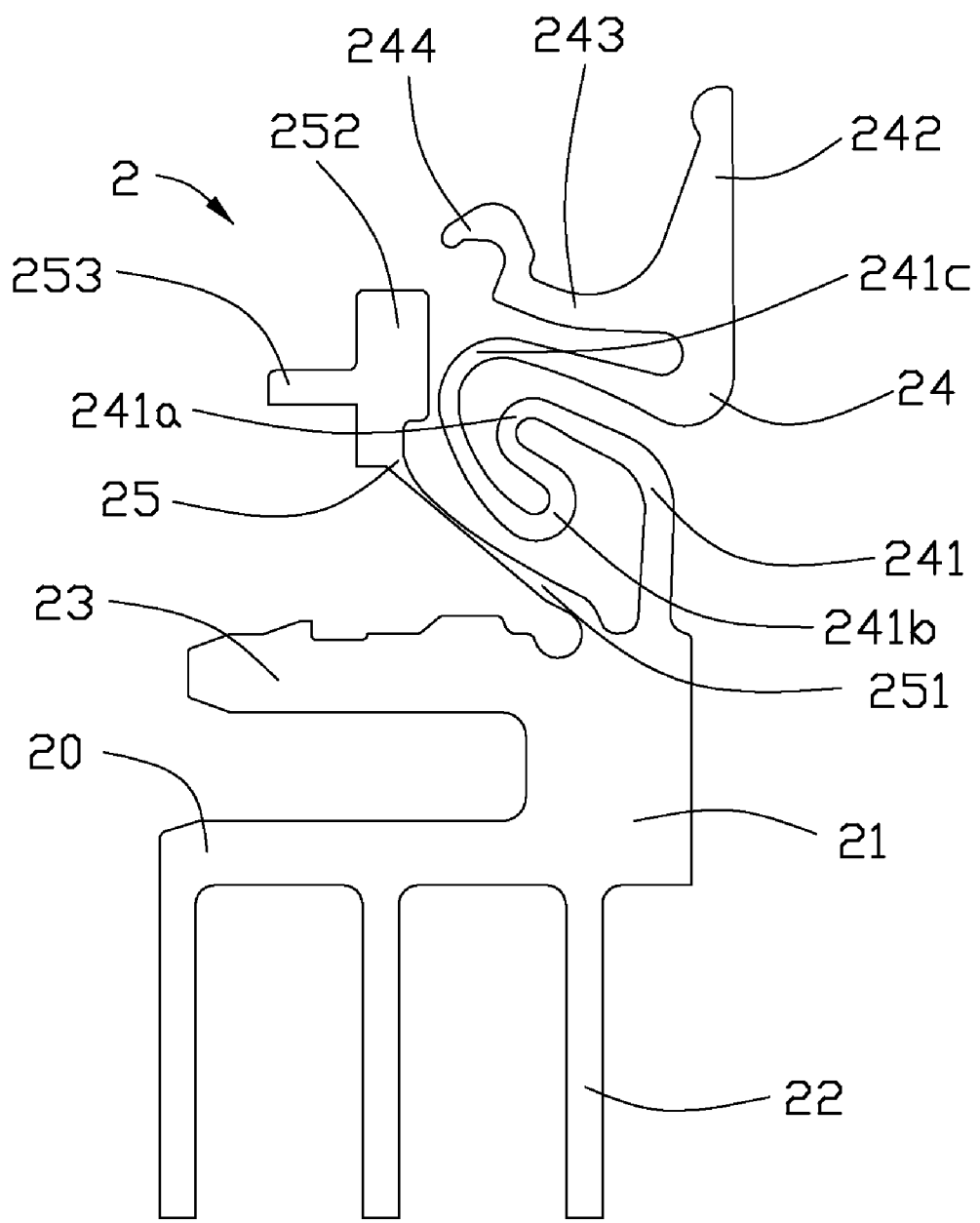
FIG. 3 is a side elevational view of the electrically conductive contact member of present invention.

Please particular refer to FIG. 3, each terminal contact 2 is formed integrally of a thin sheet of electrically conductive, spring metal material, each including a generally U-shaped central portion 21 comprising a first mounting leg 23 capable of engaging with a respective mounting opening of the socket body 1, and a second mounting leg 20 flexibly connected to one side of the first mounting leg 23. When the first mounting leg 23 of the terminal contact 2 is fixed into the socket body 1, a respective lead 22 extends downwardly from a bottom edge of the second mounting leg 20 and beyond a bottom surface of the socket body 1 for connection, as by soldering, to a circuit board.

A first and a second contact sections 24 and 25 are provided on an opposing sides of the first mounting leg 23 from that of the second mounting leg 20. The first contact section 24 comprises a first spring arm 241 formed by a long thin sinuous member and extending upwardly from an upper edge of the first mounting leg 23 and a bifurcated end including a first contact portion 243 and a lever portion 242. The first spring arm 241 includes a first curved portion 241a, a second curved portion 241b and a third curved portion 241c connected with each other, wherein an opening of the first curved portion 241a is opposite to that of the second curved portion 241b and disposed in a center of the third curved portion 241c so as to possess a spring-like property. A distal end 244 of the first contact portion 243 is formed in the shape of hook, at whose tip there defined a first electrical contact point, which is capable of engaging a top of the terminal lead 31 of the IC package 3. The second contact section 25 has a second spring arm 251 extending from the upper edge of the first mounting leg 23 and toward the first electrical contact point. An end portion of the second contact part 25 defines a second electrical contact portion 252 with a contact surface, which is capable of contacting a bottom of the same terminal leads 31 of the IC package 3. An engaging portion 253 at a suitable position of the second contact part 25 is formed.

Please still refer to FIG. 3, the width of the end of the second contact part 25 is wider than that of the first contact part 24. The engaging portion 253 is formed on the end portion of the second contact section 25 and extends horizontally from a side edge thereof.

Figure 4:
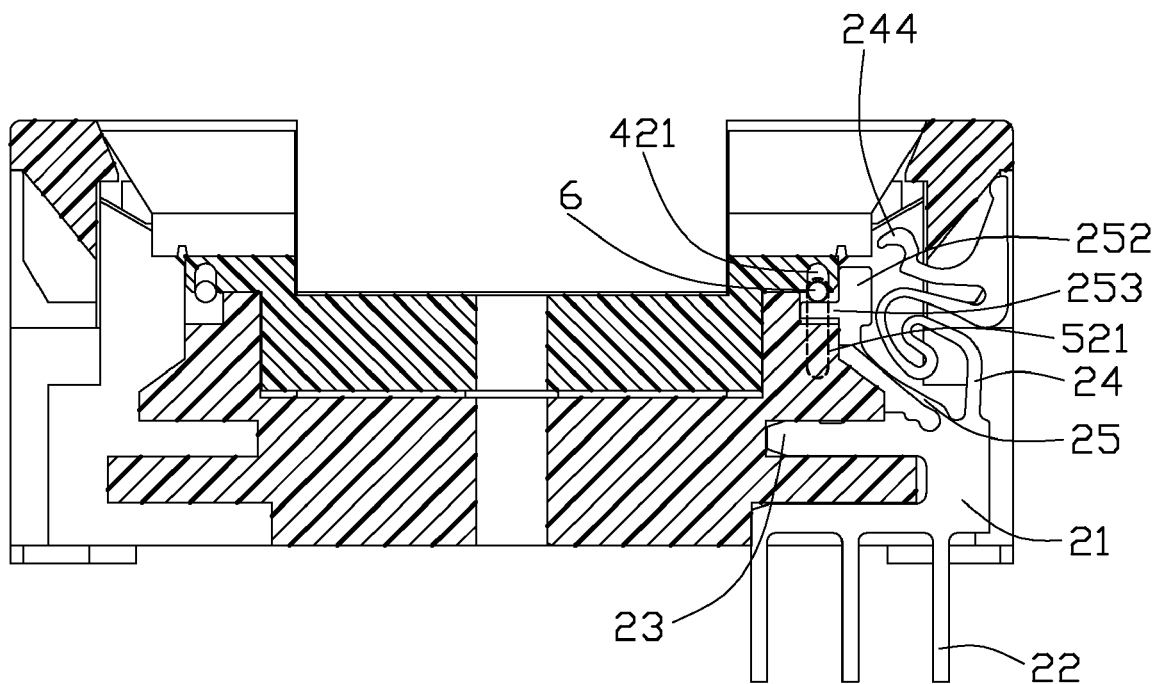
FIG. 4 is a cross section view of the socket in accordance with the preferred embodiment of present invention, wherein the operating cover is pressed down.
Figure 5:
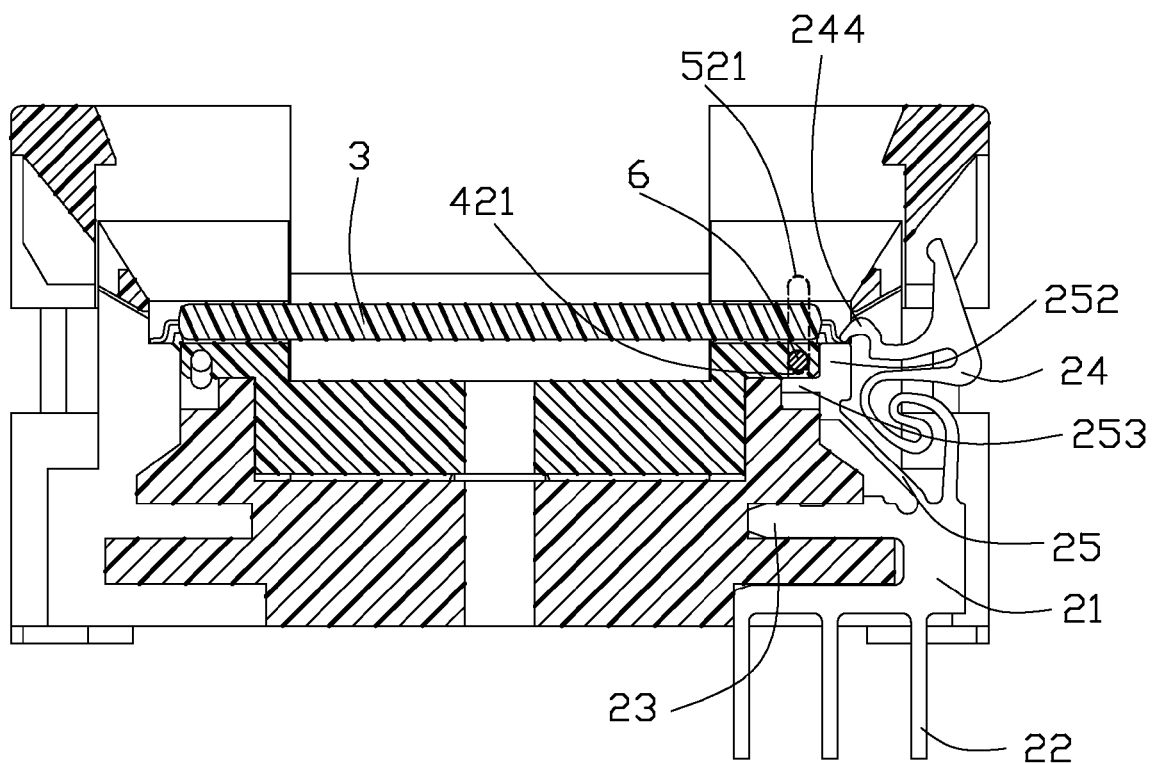
FIG. 5 is a view similar to FIG. 4, but the operating cover has been pushed up.

Please refer to FIGS. 3 to 5, the socket further comprises a stick 6, which penetrating a first engaging hole 421 provided on the front wall and rear wall 42 of the adaptor 4 and a second engaging hole 521 provided on a corresponding portion of the operating cover 5. When the stick 6 is assembled into the socket, a bottom of the stick 6 is contacted with the engaging portion 253 of the terminal contact 2. The second through hole 521 has a certain length along up-to-down direction. When the operating cover 5 is in a free position, the stick 6 is in a lower position of the second through hole 521, when the operating cover 5 is pressed down, the stick 6 is moved to a higher position in the second through hole 521.

According to this embodiment, the operating cover 5 is not moved downward when the operation cover 5 is in a free position, particular to refer to FIG. 4, and the stick 6 is in a lower position in the second through hole 521 and the second contact part of the terminal contact 2 is in a certain balanced position. When the IC package 3 will be put into the socket, firstly, the operating cover 5 is pressed down and engages with a follower tip of the lever portion 242 of the terminal contact 2, as shown in FIG. 4, the lever portion 242 moves outwardly with the operating cover 5 further pressed down. Along with this, the first electrical point of the distal 244 of the first contact section 24 moves away from the second electrical contact point of the second contact section 25 and the engaging portion 253 of the second contact section 25 moves downwardly with the operating cover 5 moving downward. Then, the IC package 3 is put on the seating surface 41 of the adaptor 4, and after the exterior force applied on the operating cover 5 is released, the operating cover 5 is pushed up by the spring forces of the spring 7 and the terminal contact 2, at the same time, the first contact section 24 moves toward the second contact section 25 and the second contact section 25 moves upwardly with the stick 6 moving to an upper position, and finally the first contact point contacts with a top face of the terminal lead 31 of the IC package 3 and the second contact point contacts with a bottom face of the terminal lead 31 of the IC package 3. With a consequence that the respective terminal contact 2 and the IC package 3 are electrically connected.

In this embodiment, the first and the second contact sections 24 and 25 can moves together with the movement of the operating cover 5, and by which the terminal lead 31 of the IC package 3 is sandwiched, thereby a respective terminal contact 2 and the IC package 3 are well electrically connected.

In this embodiment, the seating surface 41 for seating the IC package 3 is provided on the adaptor 4, however, it also can designed on the socket body 1. That is to say, the adaptor 4 is not a necessary element.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket for burn-in tests comprising:

a socket body with a plurality of contact slots;

a plurality of contacts received in corresponding contact slots, each contact including a base portion retained into the contact slot of the socket body, and first and second contact beams, each extending upwardly from an upper edge of the base portion;

an operating member movably mounted on the socket body and defining a hole extending in a vertical direction; and a shaft attached on the operating member and engageable with the second contact beam; wherein when a force is applied on the operating member, the shaft is movably received in the hole, and the first and the second contact beams cooperate with said operating member to move away from original positions.

2. The socket as claimed in claim 1, wherein the second contact beam has a second engaging portion extending from a side edge thereof and disposed below the shaft.

3. The socket as claimed in claim 1, further comprising an adaptor mounted onto the socket body and defining a supporting surface adapted for receiving an IC package.

4. The socket as claimed in claim 3, wherein the adaptor defines a first engaging hole communicating with the hole of the operating member and adapted for receiving the shaft.

5. The socket as claimed in claim 4, further comprising a spring disposed between the operating member and the socket body.

6. The socket as claimed in claim 5, wherein the first spring arm formed by a long thin sinuous member.

7. The socket as claimed in claim 1, wherein the first contact beam includes a first spring arm extending from an upper edge of the base portion and a first contact portion extending upwardly from a distal end of the first spring arm and bifurcated with a first engaging portion.

8. The socket as claimed in claim 1, wherein the second contact beam includes a second spring arm extending upwardly from an upper edge of the base portion of the contact and a second contact portion extending upwardly from a distal tip of the second spring arm.

9. An electrical connector comprising:

an insulative body sub-assembly for receiving an electronic package;

an operating cover mounted upon the sub-assembly and moveable up and down in a vertical direction between upper and lower positions; and a plurality of contacts disposed in the body sub-assembly, each of said contacts defining an upper resilient contact arm and a lower resilient contact arm defining a gap therebetween; wherein when said cover is moved to said lower position, both said upper resilient contact arm and said lower resilient contact arm are deflected away from each other to increase said gap; when said cover is moved to said upper position, both said upper resilient contact arm and said lower resilient contact arm are resumed in a relaxed manner to decrease said gap so as to tightly sandwich a corresponding lead of said electronic package for mechanical and electrical connection therebetween.

10. The electrical connector as claimed in claim 9, wherein at least the upper resilient contact arm is deflected by the cover.

11. The electrical connector as claimed in claim 9, said lower resilient contact arm is deflected by a stick which connects said cover and said sub-assembly.

12. The electrical connector as claimed in claim 11, wherein said stick is moveable relative to the sub-assembly.

13. The electrical connector as claimed in claim 12, wherein said stick limits a range of up-and-down movement of said cover relative to the sub-assembly in said vertical direction.

14. The electrical connector as claimed in claim 13, wherein said sub-assembly includes a socket body and an adaptor mounted upon the socket body, and said stick is assembled to the adaptor.

* * * * *